United States Patent
Zhan et al.

(10) Patent No.: US 12,393,261 B2
(45) Date of Patent: Aug. 19, 2025

(54) POWER CONTROL SYSTEM AND METHOD FOR HETEROGENEIOUS COMPUTING, DEVICE, AND NON-TRANSITORY READABLE STORAGE MEDIUM

(71) Applicant: SUZHOU METABRAIN INTELLIGENT TECHNOLOGY CO., LTD., Jiangsu (CN)

(72) Inventors: Yongzheng Zhan, Jiangsu (CN); Lu Zhang, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/878,821

(22) PCT Filed: Jul. 10, 2023

(86) PCT No.: PCT/CN2023/106626
§ 371 (c)(1),
(2) Date: Dec. 24, 2024

(87) PCT Pub. No.: WO2024/711387
PCT Pub. Date: Jun. 6, 2024

(65) Prior Publication Data
US 2025/0165055 A1    May 22, 2025

(30) Foreign Application Priority Data
Dec. 1, 2022   (CN) .......................... 202211530341.0

(51) Int. Cl.
*G06F 1/00*        (2006.01)
*G06F 1/3296*   (2019.01)
(Continued)

(52) U.S. Cl.
CPC ......... *G06F 1/3296* (2013.01); *H03K 17/693* (2013.01); *H03L 7/099* (2013.01)

(58) Field of Classification Search
CPC ...... G06F 1/3296; H03K 17/693; H03L 7/099
See application file for complete search history.

(56) References Cited

U.S. PATENT DOCUMENTS 10,554,209 B2 *  2/2020  Srivastava ........... H03K 3/0307
11,158,292 B2    10/2021  Chaudhari et al.
(Continued)

FOREIGN PATENT DOCUMENTS

| CN | 107797644 A | 3/2018 |
| CN | 112462913 A | 3/2021 |

(Continued)

OTHER PUBLICATIONS

International Search Report and Written Opinion received for PCT Application No. PCT/CN2023/106626 mailed on Sep. 28, 2023 (3 pages including English Translation).
(Continued)

*Primary Examiner* — Mohammed H Rehman
(74) *Attorney, Agent, or Firm* — Merchant & Gould P.C.

(57) ABSTRACT

A power control system and method for heterogeneous computing, a device, and a non-transitory readable storage medium. The system includes: a heterogeneous computing unit having a first functional module and a second functional module; a phase locked loop outputting a clock frequency of each functional module; a handshake detection unit configured to detect an access request answer sent by the first functional module and a response request answer sent by the second functional module, and generate status flags for the first functional module and the second functional module, respectively; and a frequency-controlled voltage source outputting one path of voltage bus for each functional module.

(Continued)

Each path of voltage bus is connected to a power pin of a corresponding functional module and a first switch transistor is connected in series therebetween.

20 Claims, 5 Drawing Sheets

(51) Int. Cl.
*H03K 17/693* (2006.01)
*H03L 7/099* (2006.01)

(56) References Cited

U.S. PATENT DOCUMENTS

| | | | |
|---|---|---|---|
| 12,073,227 B2 | 8/2024 | Mubeen et al. | |
| 2003/0197570 A1* | 10/2003 | Kim | H03L 1/00 331/182 |
| 2007/0085510 A1* | 4/2007 | Asada | H02P 29/032 322/28 |
| 2009/0204831 A1* | 8/2009 | Cousson | G06F 1/324 713/322 |
| 2009/0224818 A1* | 9/2009 | Yoneyama | H02P 7/04 327/333 |
| 2012/0212207 A1* | 8/2012 | Chen | G05F 3/30 323/313 |
| 2014/0237272 A1 | 8/2014 | Sadowski | |
| 2022/0206850 A1 | 6/2022 | Paul et al. | |
| 2022/0399266 A1* | 12/2022 | Song | H10D 84/0149 |

FOREIGN PATENT DOCUMENTS

| | | |
|---|---|---|
| CN | 112653730 A | 4/2021 |
| CN | 113176805 A | 7/2021 |
| CN | 113311934 A | 8/2021 |
| CN | 114090227 A | 2/2022 |
| CN | 115562470 A | 1/2023 |

OTHER PUBLICATIONS

Chinese Search Report for CN Application No. 2022115303410 (2 pages).
Chinese Search Report for CN Application No. 2022115303410 (1 page).
Qunsong Zeng, et al., "Energy-Efficient Resource Management for Federated Edge Learning With CPU-GPU Heterogeneous Computing", IEEE Transactions on Wireless Communications, 2021, 20(12):7947-7962.

* cited by examiner

POWER CONTROL SYSTEM AND METHOD FOR HETEROGENEIOUS COMPUTING, DEVICE, AND NON-TRANSITORY READABLE STORAGE MEDIUM

CROSS-REFERENCE TO RELATED APPLICATION

This application is a National Stage Application of International Application No. PCT/CN2023/106626 filed on Jul. 10, 2023, which claims the benefit of Serial No. 202211530341.0 filed on Dec. 1, 2022 in China, and which applications are incorporated herein by reference. To the extent appropriate, a claim of priority is made to each of the above disclosed applications.

TECHNICAL FIELD

Embodiments of the present disclosure relate to the field of microcircuit design, and in particular to a power control system and method for heterogeneous computing, a device, and a non-transitory readable storage medium.

BACKGROUND

Core functions, such as a central processing unit (CPU), a graphics processing unit (GPU) and a data processing unit (DPU), in a heterogeneous computing system need to perform a large amount of mathematical processing and level conversion on transmission data, resulting in that the power consumption of the entire system is up to hundreds of watts. Although the power consumption of the system can be reduced by adopting an air-cooling or liquid-cooling heat dissipation technology, it is impossible to take away all the heat inside the core, and this will also cause crash failure of the heterogeneous computing system due to the over-high temperature of the core. Especially in a case of strict power consumption requirements, the dynamic voltage regulation technology is very important.

The conventional buck-type power circuit has a complex structure, high circuit complexity and high power consumption, but the power consumption can be reduced only by adopting methods such as advanced process and buck technology, and this comes at the cost of circuit complexity and functional microcircuit performance. Meanwhile, the voltage signal output by the circuit structure is relatively single and constant, and cannot change by tracking a change in the working frequency of the functional microcircuit.

SUMMARY

In view of this, it is necessary for the problems above to provide a power control system and method for heterogeneous computing, a device, and a non-transitory readable storage medium.

According to a first aspect of embodiments of the present disclosure, provided is a power control system for heterogeneous computing, including:
  a heterogeneous computing unit, including a first functional module sending an access request and a second functional module requested;
  a phase locked loop, configured to output a clock frequency corresponding to each functional module in the heterogeneous computing unit on a one-to-one basis;
  a handshake detection unit, connected to the heterogeneous computing unit via an access bus, and configured to detect an access request answer sent by the first functional module and a response request answer sent by the second functional module, and generate, according to the access request answer and the response request answer, status flags for the first functional module and the second functional module, respectively, and output same; and
  a frequency-controlled voltage source, outputting one path of voltage bus for each functional module, wherein each path of voltage bus is connected to a power pin of a corresponding functional module and a first switch transistor is connected in series therebetween, and the frequency-controlled voltage source controls, according to the status flags of the first functional module and the second functional module, a corresponding first switch transistor to be turned on or off, and adjusts, according to the clock frequency, a voltage value of a corresponding voltage bus when the first switch transistor is turned on.

In some embodiments, the frequency-controlled voltage source includes a status strobing circuit, a comparator, and a frequency control voltage regulator;
  the status strobing circuit includes two parallel frequency branches and two parallel status branches, wherein input ends of the two parallel frequency branches are connected to outputs of the phase locked loop corresponding to the first functional module and the second functional module, respectively, input ends of the two parallel status branches are connected to status flag outputs corresponding to the first functional module and the second functional module, respectively, a second switch transistor is connected in series between an input end and an output end of each frequency branch, and the two parallel status branches are configured to drive the second switch transistors of the two frequency branches to be turned on or off, respectively;
  two input ends of the comparator are connected to output ends of the two parallel frequency branches, respectively, and an output end of the comparator is configured to output a clock frequency of a frequency branch with a relatively large clock frequency among the two parallel frequency branches to the frequency control voltage regulator; and
  the frequency control voltage regulator is configured to match an input clock frequency with a preset frequency and voltage correspondence to determine a first target output voltage, and adjust, to the first target output voltage, a voltage value of a voltage bus connected to a functional module corresponding to the clock frequency equal to the clock frequency output by the comparator.

In some embodiments, the handshake detection unit generates the status flags for the first functional module and the second functional module according to the following rules:
  in response to that the first functional module sends the access request answer, flagging a status of the first functional module as a high level signal;
  in response to that the first functional module does not send the access request answer, flagging a status of the first functional module as a low level signal;
  in response to that the second functional module sends the response request answer, flagging a status of the second functional module as a high level signal; and
  in response to that the second functional module does not send the response request answer, flagging a status of the second functional module as a low level signal.

In some embodiments, the status flags of the first functional module is connected to a first switch transistor corresponding to the first functional module, and the status flags of the second functional module is connected to a first switch transistor corresponding to the second functional module.

In some embodiments, the preset frequency and voltage correspondence is obtained by calculation according to formula I:

$$f \approx K \frac{(V_{out} - V_{th})^\alpha}{V_{out}}, \quad \text{formula I}$$

where $V_{out}$ represents the first target output voltage, f represents the clock frequency output by the comparator, K represents a preset scale factor, α represents a process parameter under carrier velocity saturation, and $V_{th}$ represents a turn-on voltage of the first switch transistor.

In some embodiments, the frequency-controlled voltage source further includes a frequency multiplication calculating unit and an interpolating resistance direct-current (DC) converter;

two input ends of the frequency multiplication calculating unit are connected to the output ends of the two parallel frequency branches, respectively, and the frequency multiplication calculating unit is configured to calculate a multiple value of a relatively large clock frequency and a relatively small clock frequency of the two parallel frequency branches and output same to the interpolating resistance DC converter; and the interpolating resistance DC converter is configured to calculate a second target output voltage according to the multiple value and the first target output voltage, and adjust, to the second target output voltage, a voltage value of a voltage bus connected to a functional module corresponding to the clock frequency not equal to the clock frequency output by the comparator.

In some embodiments, the second target output voltage is obtained by calculation according to formula II:

$$V_{oth} \approx K * \frac{V_{out}}{n}, \quad \text{formula II}$$

where $V_{oth}$ represents the second target output voltage, $V_{out}$ represents the first target output voltage, k represents a preset constant, and n represents the multiple value.

In some embodiments, the heterogeneous computing unit is of a Chiplet architecture, and includes at least two of a central processing unit (CPU), a graphics processing unit (GPU), a data processing unit (DPU), a neural processing unit (NPU), a video processing unit (VPU), an image signal processor (ISP), an accelerator, and input output (IO).

In some embodiments, all the first switch transistors and all the second switch transistors are metal-oxide-semiconductor field-effect transistors.

According to a second aspect of embodiments of the present disclosure, provided is a power control method for heterogeneous computing, including:

taking a functional module of a heterogeneous computing unit that sends an access request as a first functional module, and taking a functional module of the heterogeneous computing unit that is requested as a second functional module;

outputting, by a phase locked loop, a clock frequency corresponding to each functional module in the heterogeneous computing unit on a one-to-one basis;

connecting a handshake detection unit to the heterogeneous computing unit via an access bus, detecting, by the handshake detection unit, an access request answer sent by the first functional module and a response request answer sent by the second functional module, and generating, according to the access request answer and the response request answer, status flags for the first functional module and the second functional module, respectively, and outputting same; and outputting, by a frequency-controlled voltage source, one path of voltage bus for each functional module, connecting each path of voltage bus to a power pin of a corresponding functional module and connecting in series a first switch transistor therebetween, controlling, by the frequency-controlled voltage source according to the status flags of the first functional module and the second functional module, a corresponding first switch transistor to be turned on or off, and adjusting, according to the clock frequency, a voltage value of a corresponding voltage bus when the first switch transistor is turned on.

In some embodiments, the frequency-controlled voltage source includes a status strobing circuit, a comparator, and a frequency control voltage regulator;

the status strobing circuit includes two parallel frequency branches and two parallel status branches, wherein input ends of the two parallel frequency branches are connected to outputs of the phase locked loop corresponding to the first functional module and the second functional module, respectively, input ends of the two parallel status branches are connected to status flag outputs corresponding to the first functional module and the second functional module, respectively, a second switch transistor is connected in series between an input end and an output end of each frequency branch, and driving, by the two parallel status branches, the second switch transistors of the two frequency branches to be turned on or off, respectively;

two input ends of the comparator are connected to output ends of the two parallel frequency branches, respectively, and an output end of the comparator is configured to output a clock frequency of a frequency branch with a relatively large clock frequency among the two parallel frequency branches to the frequency control voltage regulator; and matching, by the frequency control voltage regulator, an input clock frequency with a preset frequency and voltage correspondence to determine a first target output voltage, and adjusting, to the first target output voltage, a voltage value of a voltage bus connected to a functional module corresponding to the clock frequency equal to the clock frequency output by the comparator.

In some embodiments, the handshake detection unit generates the status flags for the first functional module and the second functional module according to the following rules:

in response to that the first functional module sends the access request answer, flagging a status of the first functional module as a high level signal;

in response to that the first functional module does not send the access request answer, flagging a status of the first functional module as a low level signal;

in response to that the second functional module sends the response request answer, flagging a status of the second functional module as a high level signal; and in response to that the second functional module does not send the response request answer, flagging a status of the second functional module as a low level signal.

In some embodiments, the status flags of the first functional module is connected to a first switch transistor corresponding to the first functional module, and the status flags of the second functional module is connected to a first switch transistor corresponding to the second functional module.

In some embodiments, the preset frequency and voltage correspondence is obtained by calculation according to formula I:

$$f \approx K \frac{(V_{out} - V_{th})^\alpha}{V_{out}}, \quad \text{formula I}$$

where $V_{out}$ represents the first target output voltage, f represents the clock frequency output by the comparator, K represents a preset scale factor, $\alpha$ represents a process parameter under carrier velocity saturation, and $V_{th}$ represents a turn-on voltage of the first switch transistor.

In some embodiments, the frequency-controlled voltage source further includes a frequency multiplication calculating unit and an interpolating resistance direct-current (DC) converter, and the method further includes:

connecting two input ends of the frequency multiplication calculating unit to the output ends of the two parallel frequency branches, respectively, and calculating, by the frequency multiplication calculating unit, a multiple value of a relatively large clock frequency and a relatively small clock frequency of the two parallel frequency branches and outputting same to the interpolating resistance DC converter; and calculating, by the interpolating resistance DC converter according to the multiple value and the first target output voltage, a second target output voltage, and adjusting, to the second target output voltage, a voltage value of a voltage bus connected to a functional module corresponding to the clock frequency not equal to the clock frequency output by the comparator.

In some embodiments, the second target output voltage is obtained by calculation according to formula II:

$$V_{oth} \approx K * \frac{V_{out}}{n}, \quad \text{formula II}$$

where $V_{oth}$ represents the second target output voltage, $V_{out}$ represents the first target output voltage, k represents a preset constant, and n represents the multiple value.

In some embodiments, the heterogeneous computing unit is of a Chiplet architecture, and includes at least two of a central processing unit (CPU), a graphics processing unit (GPU), a data processing unit (DPU), a neural processing unit (NPU), a video processing unit (VPU), an image signal processor (ISP), an accelerator, and input output (IO).

In some embodiments, all the first switch transistors and all the second switch transistors are metal-oxide-semiconductor field-effect transistors.

According to a third aspect of embodiments of the present disclosure, further provided is a computer device, including:

at least one processor; and a memory, storing a computer program which is capable of running in the processor, wherein the computer program, when executed by the processor, executes the power control method for heterogeneous computing mentioned above.

According to a fourth aspect of embodiments of the present disclosure, further provided is a non-transitory readable storage medium, storing a computer program, wherein the computer program, when executed by a processor, executes the power control method for heterogeneous computing mentioned above.

According to the power control system for heterogeneous computing mentioned above, working statuses of the functional modules are detected by the handshake detection unit, the clock frequency of the functional modules is output by the phase locked loop, and the first switch transistors are further added between the voltage buses and the functional modules for isolation, so that the frequency-controlled voltage source dynamically regulates the power supply and voltages of the functional modules in combination with the working statuses and the clock frequency. Compared with a conventional DC-DC buck module, the power consumption of the system is effectively reduced, and the impact of power ripples on the functional modules is avoided. Meanwhile, the isolation between a power signal and the functional modules is effectively implemented by means of access detection isolation control, thereby not only avoiding the impact of ripples, but also reducing the leakage power consumption caused by internal switch transistors and the power consumption when the functional modules are idle.

In addition, the embodiments of the present disclosure further provide a power control method for heterogeneous computing, a computer device, and a non-transitory readable storage medium, which can also achieve the described technical effects, and will not be described herein again.

BRIEF DESCRIPTION OF THE DRAWINGS

In order to explain the embodiments in the present disclosure or the prior art more clearly, drawings that need to be used in the description of the embodiments or the prior art will be briefly introduced below. Obviously, the drawings described below are only some embodiments of the present disclosure. For those of ordinary skill in the art, other embodiments can also be obtained based on these drawings without paying any creative labor.

DETAILED DESCRIPTION OF THE EMBODIMENTS

Chiplet is building of different functional microcircuit bare dies, and is also building of different intellectual property (IP) cores in a sense. Finalization of Moore's law accelerates the requirement and use of heterogeneous Chiplet, which is widely applied to computing systems such as high-performance operation processors, high-performance artificial intelligence (AI) computing and Internet of Things, and wireless edges, and also adds flexibility and applicability to next-generation microcircuit evolution. However, core functions, such as a central processing unit (CPU), a graphics processing unit (GPU) and a data processing unit (DPU), in a heterogeneous computing system need to perform a large amount of mathematical processing and level conversion on transmission data, resulting in that the power consumption of the entire system is up to hundreds of watts. Although the power consumption of the system can be reduced by adopting an air-cooling or liquid-cooling heat dissipation technology, it is impossible to take away all the heat inside the core, and this will also cause crash failure of the heterogeneous computing system due to the over-high temperature of the core. Especially in a case of strict power consumption requirements, the dynamic voltage regulation technology is very important.

Figure 1:
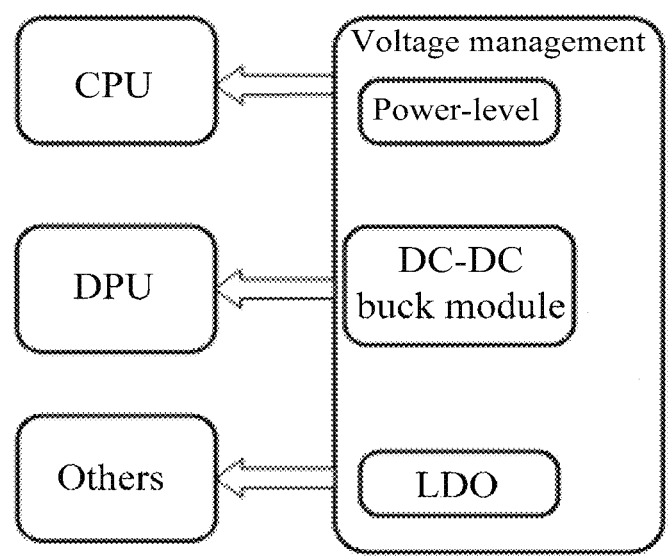
FIG. 1 is a schematic structural diagram of a buck-type power circuit provided according to one embodiment of the present disclosure.

A current microcircuit working voltage has been reduced from previous 5 V to 3.3 V, 2.5 V, 1.8 V, or even lower. In order to maintain characteristics such as high stability and low noise of a voltage signal while reducing a voltage, a conventional buck-type power management technology is generally used, and a structure thereof is shown in FIG. 1. In conventional buck-type power management, a buck-type power circuit includes a power consumption level circuit, a direct current-direct current (DC-DC) buck module, a low dropout regulator (LDO), and the like, wherein the power consumption level circuit converts a high input voltage into a low output voltage that can be directly supplied to a required functional microcircuit, and the low output voltage can also be subjected to voltage division processing by the DC-DC buck module to output a lower voltage signal. The LDO mainly performs ripple processing on an output voltage to output a high-quality voltage signal. The conventional buck-type power circuit has a complex structure, high circuit complexity and high power consumption, but the power consumption can be reduced only by adopting methods such as advanced process and buck technology, and this comes at the cost of circuit complexity and functional microcircuit performance. Meanwhile, the voltage signal output by the circuit structure is relatively single and constant, and cannot change by tracking a change in the working frequency of the functional microcircuit.

To make the objectives, embodiments, and advantages of the present disclosure clearer, the following describes the embodiments of the present disclosure in detail in conjunction with optional embodiments and with reference to the drawings.

It needs to be noted that, in the embodiments of the present disclosure, the expressions of "first" and "second" are used for distinguishing two entities that have the same name but are not identical or non-identical parameters. It can be understood that the use of "first" and "second" is solely for convenience of description, and should not be understood as limitations to the embodiments of the present disclosure, and the subsequent embodiments will not be described one by one.

Figure 2:
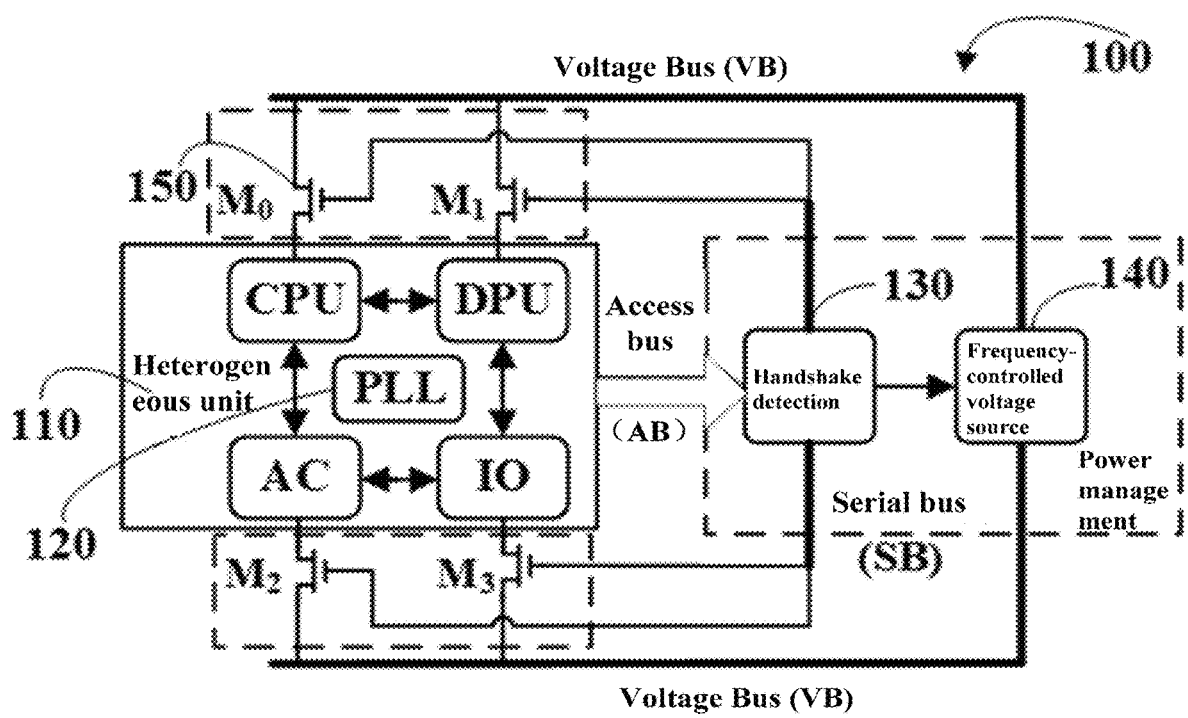
FIG. 2 is a schematic structural diagram of a power control system for heterogeneous computing provided according to one embodiment of the present disclosure.

In one embodiment, referring to FIG. 2, an embodiment of the present disclosure provides a power control system 100 for heterogeneous computing. The system includes:

a heterogeneous computing unit 110, including a first functional module sending an access request and a second functional module requested;

it needs to be noted that the first functional module and the second functional module may both be any functional module in the heterogeneous computing unit, the difference therebetween lies in that one is used for requesting access and the other is used for being requested to access, and taking Chiplet including a CPU and a DPU as an example, the CPU may serve as the first functional module, and the DPU may serve as the second functional module;

a phase locked loop (PPL) 120, configured to output a clock frequency corresponding to each functional module in the heterogeneous computing unit on a one-to-one basis;

a handshake detection unit 130, connected to the heterogeneous computing unit 110 via an access bus, and configured to detect an access request answer sent by the first functional module and a response request answer sent by the second functional module, and generate, according to the access request answer and the response request answer, status flags for the first functional module and the second functional module, respectively, and output same; and a frequency-controlled voltage source 140, outputting one path of voltage bus for each functional module, wherein each path of voltage bus is connected to a power pin of a corresponding functional module and a first switch transistor 150 (i.e., $M_0$ to $M_3$ in FIG. 2) is connected in series therebetween, and the frequency-controlled voltage source 140 controls, according to the status flags of the first functional module and the second functional module, a corresponding first switch transistor 150 to be turned on or off, and adjusts, according to the clock frequency, a voltage value of a corresponding voltage bus when the first switch transistor 150 is turned on.

According to the power control system for heterogeneous computing mentioned above, working statuses of the functional modules are detected by the handshake detection unit, the clock frequency of the functional modules is output by the phase locked loop, and the first switch transistors are further added between the voltage buses and the functional modules for isolation, so that the frequency-controlled voltage source dynamically regulates the power supply and voltages of the functional modules in combination with the working statuses and the clock frequency. Compared with a conventional DC-DC buck module, the power consumption of the system is effectively reduced, and the impact of power ripples on functional microcircuits is avoided. Meanwhile, the isolation between power signals and the functional modules is effectively implemented by means of access detection and isolation control, thereby not only avoiding the impact of ripples, but also reducing the leakage power consumption caused by internal switch transistors and the power consumption when the functional modules are idle.

Figure 3:
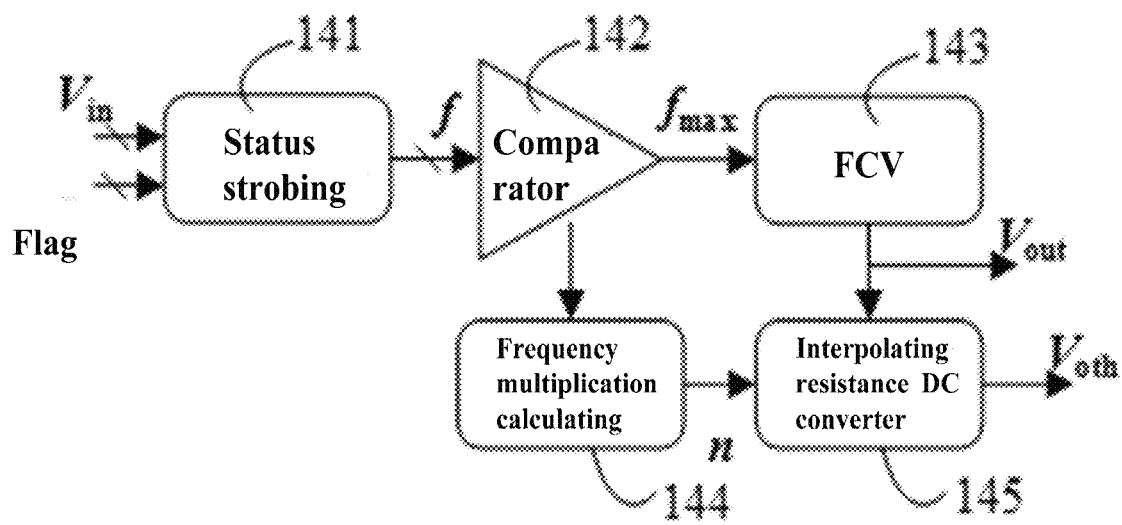
FIG. 3 is a schematic diagram of a frequency-controlled voltage source circuit provided according to one embodiment of the present disclosure.

In some embodiments, in conjunction with FIG. 3, the frequency-controlled voltage source 140 includes a status strobing circuit 141, a comparator 142, and a frequency control voltage regulator 143;

the status strobing circuit 141 includes two parallel frequency branches and two parallel status branches, wherein input ends of the two parallel frequency branches are connected to outputs of the phase locked loop corresponding to the first functional module and the second functional module, respectively, input ends of the two parallel status branches are connected to status flag outputs corresponding to the first functional module and the second functional module, respectively, a second switch transistor (not shown) is connected in series between an input end and an output end of each frequency branch, and the two parallel status branches are configured to drive the second switch transistors of the two frequency branches to be turned on or off, respectively;

two input ends of the comparator 142 are connected to output ends of the two parallel frequency branches, respectively, and an output end of the comparator 142 is configured to output a clock frequency of a frequency branch with a relatively large clock frequency among the two parallel frequency branches to the frequency control voltage regulator 143; and the frequency control voltage (FCV) regulator 143 is configured to match an input clock frequency with a preset frequency and voltage correspondence to determine a first target output voltage (corresponding to $V_{out}$ in FIG. 3), and adjust, to the first target output voltage, a voltage value of a voltage bus connected to a functional module corresponding to the clock frequency equal to the clock frequency output by the comparator 142.

In some embodiments, the handshake detection unit 130 generates the status flags for the first functional module and the second functional module according to the following rules:

in response to that the first functional module sends the access request answer, flagging a status of the first functional module as a high level signal;

in response to that the first functional module does not send the access request answer, flagging a status of the first functional module as a low level signal;

in response to that the second functional module sends the response request answer, flagging a status of the second functional module as a high level signal; and in response to that the second functional module does not send the response request answer, flagging a status of the second functional module as a low level signal.

In some embodiments, the status flags of the first functional module and the second functional module are connected to the corresponding first switch transistors 150, and the status flags of the first functional module is connected to a first switch transistor corresponding to the first functional module, and the status flags of the second functional module is connected to a first switch transistor corresponding to the second functional module.

In some embodiments, the preset frequency and voltage correspondence is obtained by calculation according to formula I:

$$f \approx K \frac{(V_{out} - V_{th})^\alpha}{V_{out}}, \qquad \text{formula I}$$

where $V_{out}$ represents the first target output voltage, f represents the clock frequency output by the comparator, K represents a preset scale factor, α represents a process parameter under carrier velocity saturation, and $V_{th}$ represents a turn-on voltage of the first switch transistor.

In some embodiments, in conjunction with FIG. 3 again, the frequency-controlled voltage source 140 further includes a frequency multiplication calculating unit 144 and an interpolating resistance DC converter 145;

two input ends of the frequency multiplication calculating unit 144 are connected to the output ends of the two parallel frequency branches, respectively, and the frequency multiplication calculating unit is configured to calculate a multiple value of a relatively large clock frequency and a relatively small clock frequency of the two parallel frequency branches and output same to the interpolating resistance DC converter 145; and the interpolating resistance DC converter 145 is configured to calculate a second target output voltage (corresponding to $V_{oth}$ in FIG. 3) according to the multiple value and the first target output voltage, and adjust, to the second target output voltage, a voltage value of a voltage bus connected to a functional module corresponding to the clock frequency not equal to the clock frequency output by the comparator 142.

In some embodiments, the second target output voltage is obtained by calculation according to formula II:

$$V_{oth} \approx K * \frac{V_{out}}{n}, \qquad \text{formula II}$$

where $V_{oth}$ represents the second target output voltage, $V_{out}$ represents the first target output voltage, k represents a preset constant, and n represents the multiple value.

In some embodiments, the heterogeneous computing unit 110 is of a Chiplet architecture, and includes at least two of a CPU, a GPU, a DPU, a NPU, a VPU, an ISP, an accelerator, and IO.

In some embodiments, all the first switch transistors and all the second switch transistors are metal-oxide-semiconductor field-effect (MOS) transistors.

In another embodiment, in order to facilitate understanding of the solution of the embodiment of the present disclosure, in conjunction with taking the Chiplet heterogeneous computing unit including the CPU and the DPU shown in FIG. 2 as an example, it is assumed that the CPU is a first functional module and the DPU is a second functional module, and in conjunction with the frequency-controlled voltage source shown in FIG. 3, a working process of the power control system for heterogeneous computing provided by the embodiment of the present disclosure will be described in detail below:

Step 1, when powered on, a voltage bus (VB) is set to an initial voltage value, such as 1.8 V, and is configured to control a power supply voltage of a CPU and a DPU in a heterogeneous unit, and MOS switch transistors $M_0$ and Mi are both set to a turned-on status, are controlled by an access request answer and a response request answer via a serial bus (SB), and are configured to isolate the VB and the heterogeneous unit, so as to reduce a leakage current of the heterogeneous unit and avoid the impact of power ripples.

Step 2, handshake detection is used for judging whether a handshake of the access request answer sent by the CPU and the response request answer sent by the DPU in the heterogeneous unit is successful or not; and according to a result, a corresponding status flag is output.

Step 3, a precondition for the heterogeneous unit to be able to send an access request answer signal and a response request answer signal for the first time is that the MOS transistor $M_0$ connected in series to the functional module is turned on and an initial power supplies power normally; and as long as the access request answer signal is sent, the first functional module is in a normal working status, and outputs a high level flag signal.

Step 4, if the response can be answered correctly, a normal working status flag of the second functional module is output and marked as a high level, and at the same time, the MOS transistor Mi connected in series thereto is turned on, and the second functional module is turned on and is in a busy status; and if the response is not answered successfully, an error working status flag of the second functional module is output and marked as a low level, and at the same time, the MOS transistor Mi connected in series thereto is turned off, and the second functional module is turned off and is in an idle or waiting status.

Step 5, a frequency-controlled voltage source receives a clock signal (provided by an embedded PLL) and an output flag signal in the heterogeneous unit, and tracks a frequency to output a corresponding voltage value without affecting system performance.

Step 6, in the frequency-controlled voltage source, a status strobing circuit outputs one or more clock signals (Vin) according to a flag status, for subsequent frequency comparison and multiple calculation, wherein each strobing path consists of one MOS switch transistor.

Step 7, in the frequency-controlled voltage source, a comparator is implemented by an up-down counting unit, and finds out a clock signal with a maximum frequency ($f_{max}$).

Step 8, in the frequency-controlled voltage source, a frequency control voltage regulator is implemented by a predefined table look-up means, and takes a voltage value under the output maximum frequency $f_{max}$ as $V_{out}$, wherein reference is made to the following table 1 for the looked-up table.

TABLE 1

| Correspondence between output maximum frequency and voltage | |
|---|---|
| f/MHz | U/V |
| 96 | 1.2 |
| 84 | 1.15 |
| 72 | 1.1 |
| 60 | 1.0 |

Step 9, in the frequency-controlled voltage source, other frequencies less than the maximum frequency, in combination with a linear relationship between a voltage and a frequency, can be adjusted by means of frequency multiplication calculation and an interpolating resistance DC converter, so as to output a suitable voltage value $V_{oth}$ under a certain working frequency.

The power control system for heterogeneous computing in this embodiment has at least the following beneficial effects: a dynamic frequency control source method based on table lookup replaces a power-level circuit and an LDO, and a linear interpolating resistance means replaces a DC-DC buck module, thereby effectively reducing the power consumption of the system and avoiding the impact of power ripples on functional microcircuits. Meanwhile, access detection and MOS transistor isolation control effectively implement the isolation between power signals and the functional microcircuits, thereby not only avoiding the impact of ripples, but also reducing leakage power consumption caused by internal CMOS switches and the power consumption when the functional microcircuits are idle. The power control system for heterogeneous computing can be applied to a Die To Die (D2D, also referred to as die interconnection) heterogeneous computing system under different working frequencies, and has good universality.

Figure 4:
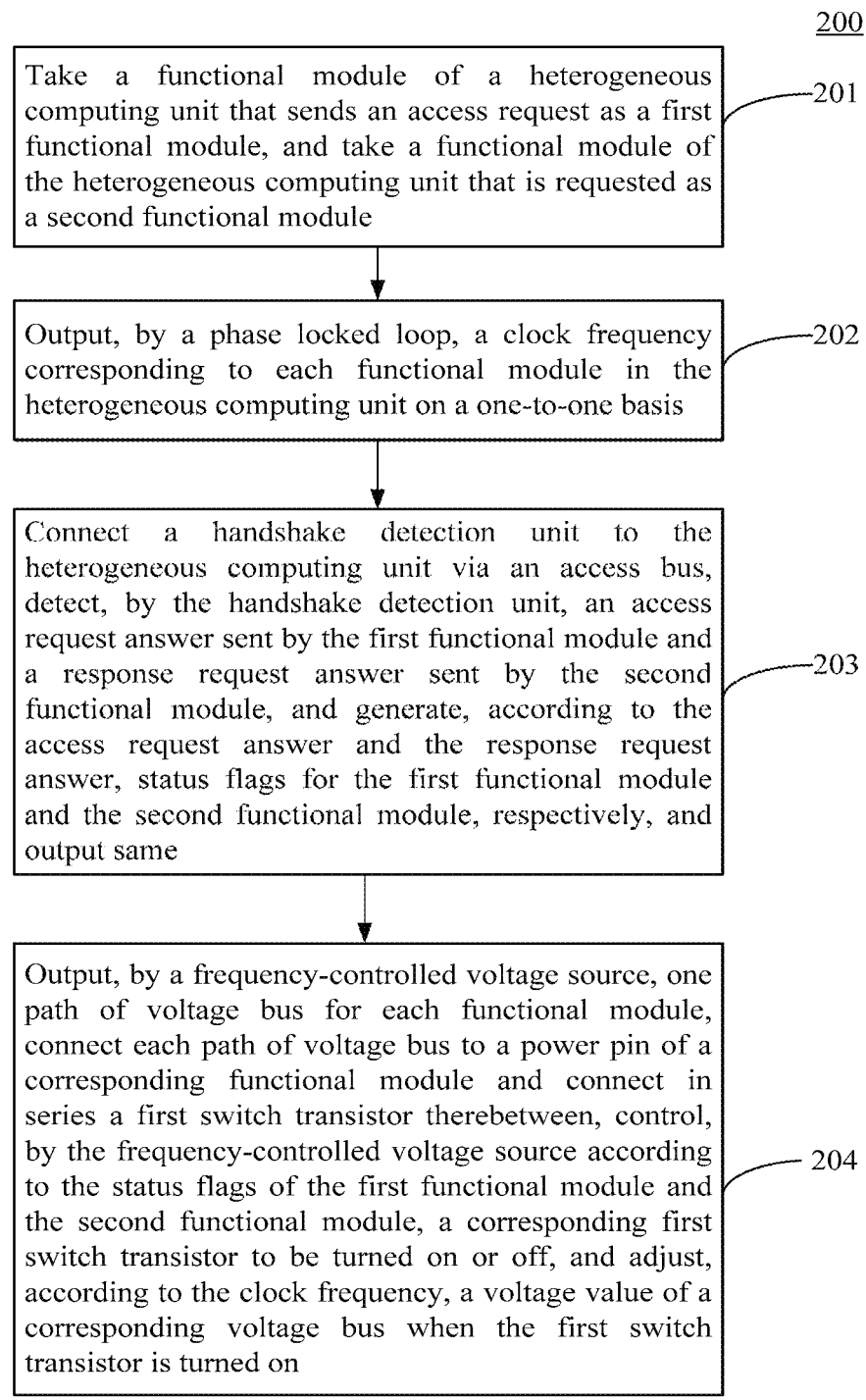
FIG. 4 is a flowchart of another power control method for heterogeneous computing provided according to another embodiment of the present disclosure.

In another embodiment, in conjunction with FIG. 4, an embodiment of the present disclosure further provides a power control method 200 for heterogeneous computing. The method includes the following steps:

Step 201, taking a functional module of a heterogeneous computing unit that sends an access request as a first functional module, and taking a functional module of the heterogeneous computing unit that is requested as a second functional module;

Step 202, outputting, by a phase locked loop, a clock frequency corresponding to each functional module in the heterogeneous computing unit on a one-to-one basis;

Step 203, connecting a handshake detection unit to the heterogeneous computing unit via an access bus, detecting, by the handshake detection unit, an access request answer sent by the first functional module and a response request answer sent by the second functional module, and generating, according to the access request answer and the response request answer, status flags for the first functional module and the second functional module, respectively, and outputting same; and Step 204, outputting, by a frequency-controlled voltage source, one path of voltage bus for each functional module, connecting each path of voltage bus to a power pin of a corresponding functional module and connecting in series a first switch transistor therebetween, controlling, by the frequency-controlled voltage source according to the status flags of the first functional module and the second functional module, a corresponding first switch transistor to be turned on or off, and adjusting, according to the clock frequency, a voltage value of a corresponding voltage bus when the first switch transistor is turned on.

According to the power control method for heterogeneous computing mentioned above, working statuses of the functional modules are detected by the handshake detection unit, the clock frequency of the functional modules is output by the phase locked loop, and the first switch transistors are further added between the voltage buses and the functional modules for isolation, so that the frequency-controlled voltage source dynamically regulates the power supply and voltages of the functional modules in combination with the working statuses and the clock frequency. Compared with a conventional DC-DC buck module, the power consumption of the system is effectively reduced, and the impact of power ripples on functional modules is avoided. Meanwhile, the isolation between power signals and the functional modules is effectively implemented by means of access detection and isolation control, thereby not only avoiding the impact of ripples, but also reducing the leakage power consumption caused by internal switch transistors and the power consumption when the functional modules are idle.

In some embodiments, the frequency-controlled voltage source includes a status strobing circuit, a comparator, and a frequency control voltage regulator;

the status strobing circuit includes two parallel frequency branches and two parallel status branches, wherein input ends of the two parallel frequency branches are connected to outputs of the phase locked loop corresponding to the first functional module and the second functional module, respectively, input ends of the two parallel status branches are connected to status flag outputs corresponding to the first functional module and the second functional module, respectively, a second switch transistor is connected in series between an input end and an output end of each frequency branch, and driving, by the two parallel status branches, the second switch transistors of the two frequency branches to be turned on or off, respectively;

two input ends of the comparator are connected to output ends of the two parallel frequency branches, respectively, and an output end of the comparator is configured to output a clock frequency of a frequency branch with a relatively large clock frequency among the two parallel frequency branches to the frequency control voltage regulator; and matching, by the frequency control voltage regulator, an input clock frequency with a preset frequency and voltage correspondence to determine a first target output voltage, and adjusting, to the first target output voltage, a voltage value of a voltage bus connected to a functional module corresponding to the clock frequency equal to the clock frequency output by the comparator.

In some embodiments, the handshake detection unit generates the status flags for the first functional module and the second functional module according to the following rules:

in response to that the first functional module sends the access request answer, flagging a status of the first functional module as a high level signal;

in response to that the first functional module does not send the access request answer, flagging a status of the first functional module as a low level signal;

in response to that the second functional module sends the response request answer, flagging a status of the second functional module as a high level signal; and in response to that the second functional module does not send the response request answer, flagging a status of the second functional module as a low level signal.

In some embodiments, the status flags of the first functional module is connected to a first switch transistor corresponding to the first functional module, and the status flags of the second functional module is connected to a first switch transistor corresponding to the second functional module.

In some embodiments, the preset frequency and voltage correspondence is obtained by calculation according to formula I:

$$f \approx K \frac{(V_{out} - V_{th})^\alpha}{V_{out}}, \quad \text{formula I}$$

where $V_{out}$ represents the first target output voltage, f represents the clock frequency output by the comparator, K represents a preset scale factor, α represents a process parameter under carrier velocity saturation, and $V_{th}$ represents a turn-on voltage of the first switch transistor.

In some embodiments, the frequency-controlled voltage source further includes a frequency multiplication calculating unit and an interpolating resistance DC converter, and the method further includes:

connecting two input ends of the frequency multiplication calculating unit to the output ends of the two parallel frequency branches, respectively, and calculating, by the frequency multiplication calculating unit, a multiple value of a relatively large clock frequency and a relatively small clock frequency of the two parallel frequency branches and outputting same to the interpolating resistance DC converter; and calculating, by the interpolating resistance DC converter according to the multiple value and the first target output voltage, a second target output voltage, and adjusting, to the second target output voltage, a voltage value of a voltage bus connected to a functional module corresponding to the clock frequency not equal to the clock frequency output by the comparator.

In some embodiments, the second target output voltage is obtained by calculation according to formula II:

$$V_{oth} \approx K * \frac{V_{out}}{n}, \quad \text{formula II}$$

where $V_{oth}$ represents the second target output voltage, $V_{out}$ represents the first target output voltage, k represents a preset constant, and n represents the multiple value.

In some embodiments, the heterogeneous computing unit is of a Chiplet architecture, and includes at least two of a CPU, a GPU, a DPU, a NPU, a VPU, an ISP, an accelerator, and IO.

In some embodiments, all the first switch transistors and all the second switch transistors are MOS transistors.

It needs to be noted that, for the limitation on the power control method for heterogeneous computing, reference may be made to the limitation on the power control system for heterogeneous computing mentioned above, which is not described herein again.

Figure 5:
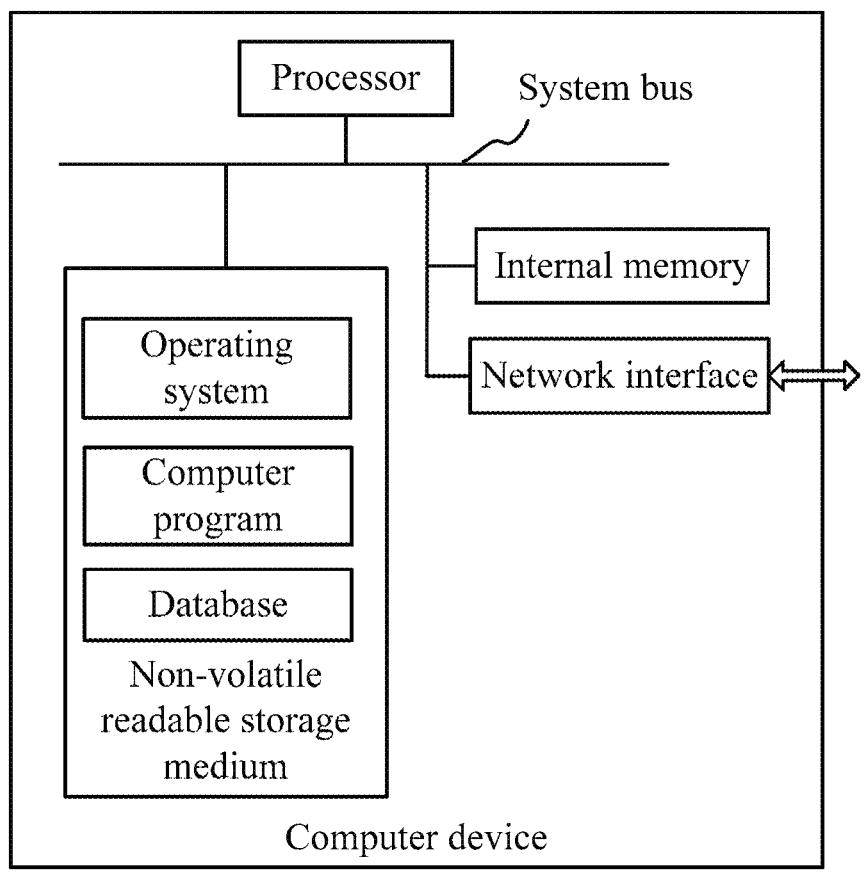
FIG. 5 is an internal structural diagram of a computer device according to another embodiment of the present disclosure.

According to another aspect of embodiments of the present disclosure, provided is a computer device that may be a server. For an internal structural diagram of the computer device, reference is made to FIG. 5. The computer device includes a processor, a memory, a network interface and a database connected via a system bus. The processor of the computer device is configured to provide computing and control capability. The memory of the computer device includes a non-transitory readable storage medium and an internal memory. The non-transitory readable storage medium stores an operating system, a computer program, and a database. The internal memory provides an environment for running of the operating system and the computer program in the non-transitory readable storage medium. The database of the computer device is configured to store data. The network interface of the computer device is configured to be in communication with an external terminal via network connection. The computer program, when executed by the processor, implements the power control method for heterogeneous computing mentioned above. The method includes the following steps:

taking a functional module of a heterogeneous computing unit that sends an access request as a first functional module, and taking a functional module of the heterogeneous computing unit that is requested as a second functional module;

outputting, by a phase locked loop, a clock frequency corresponding to each functional module in the heterogeneous computing unit on a one-to-one basis;

connecting a handshake detection unit to the heterogeneous computing unit via an access bus, detecting, by the handshake detection unit, an access request answer sent by the first functional module and a response request answer sent by the second functional module, and generating, according to the access request answer and the response request answer, status flags for the first functional module and the second functional module, respectively, and outputting same; and outputting, by a frequency-controlled voltage source, one path of voltage bus for each functional module, connecting each path of voltage bus to a power pin of a corresponding functional module and connecting in series a first switch transistor therebetween, controlling, by the frequency-controlled voltage source according to the status flags of the first functional module and the second functional module, a corresponding first switch transistor to be turned on or off, and adjusting, according to the clock frequency, a voltage value of a corresponding voltage bus when the first switch transistor is turned on.

According to another aspect of embodiments of the present disclosure, provided is a non-transitory readable storage medium, storing a computer program thereon, wherein the computer program, when executed by a processor, executes the power control method for heterogeneous computing mentioned above. The method includes the following steps:

taking a functional module of a heterogeneous computing unit that sends an access request as a first functional module, and taking a functional module of the heterogeneous computing unit that is requested as a second functional module;

outputting, by a phase locked loop, a clock frequency corresponding to each functional module in the heterogeneous computing unit on a one-to-one basis;

connecting a handshake detection unit to the heterogeneous computing unit via an access bus, detecting, by the handshake detection unit, an access request answer sent by the first functional module and a response request answer sent by the second functional module, and generating, according to the access request answer and the response request answer, status flags for the first functional module and the second functional module, respectively, and outputting same; and outputting, by a frequency-controlled voltage source, one path of voltage bus for each functional module, connecting each path of voltage bus to a power pin of a corresponding functional module and connecting in series a first switch transistor therebetween, controlling, by the frequency-controlled voltage source according to the status flags of the first functional module and the second functional module, a corresponding first switch transistor to be turned on or off, and adjusting, according to the clock frequency, a voltage value of a corresponding voltage bus when the first switch transistor is turned on.

Those of ordinary skill in the art may understand that all or a part of the processes of the methods in the foregoing embodiments may be implemented by a computer program instructing relevant hardware. The computer program may be stored in a non-transitory readable storage medium. The computer program, when executed, may include the processes of the methods in the foregoing embodiments. Any reference to memory, storage, database, or other non-transitory readable storage media used in respective embodiments provided according to the embodiments of the present disclosure may include non-transitory and/or volatile memory. The non-transitory memory may include read-only memory (ROM), programmable ROM (PROM), electrically programmable ROM (EPROM), electrically erasable programmable ROM (EEPROM), or flash memory. The volatile memory may include random access memory (RAM) or external cache memory. By way of illustration and not limitation, the RAM is available in a variety of forms, such as static RAM (SRAM), dynamic RAM (DRAM), synchronous DRAM (SDRAM), double data rate SDRAM (DDRSDRAM), enhanced SDRAM (ESDRAM), synchlink DRAM (SLDRAM), rambus direct RAM (RDRAM), direct rambus dynamic RAM (DRDRAM), and rambus dynamic RAM (RDRAM).

Various technical features of the foregoing embodiments may be combined in any way, and for brevity of description, all possible combinations of the technical features in the foregoing embodiments are not described. However, as long as combinations of these technical features are not contradictory, all these technical features should be considered to fall within the scope of the specification.

The foregoing embodiments merely express several implementations of the embodiments of the present disclosure, and are described in detail, but should not be understood as a limitation on the patent scope of the present disclosure. It should be pointed out that for those of ordinary skill in the art, without departing from the concept of the embodiments of the present disclosure, various modifications and improvements may also be made, and all these modifications and improvements belong to the scope of protection of the embodiments of the present disclosure. Therefore, the scope of protection of patent of the embodiments of the present disclosure shall be subject to the appended claims.

What is claimed is:

1. A power control system for heterogeneous computing, comprising:
   a heterogeneous computing unit, comprising a first functional module sending an access request and a second functional module requested;
   a phase locked loop, configured to output a clock frequency corresponding to each functional module in the heterogeneous computing unit on a one-to-one basis;
   a handshake detection unit, connected to the heterogeneous computing unit via an access bus, and configured to detect an access request answer sent by the first functional module and a response request answer sent by the second functional module, and generate, according to the access request answer and the response request answer, status flags for the first functional module and the second functional module, respectively, and output same; and
   a frequency-controlled voltage source, outputting one path of voltage bus for each functional module, wherein each path of voltage bus is connected to a power pin of a corresponding functional module and a first switch transistor is connected in series therebetween, and the frequency-controlled voltage source controls, according to the status flags of the first functional module and the second functional module, a corresponding first switch transistor to be turned on or off, and adjusts, according to the clock frequency, a voltage value of a corresponding voltage bus when the first switch transistor is turned on.

2. The power control system for heterogeneous computing as claimed in claim 1, wherein the frequency-controlled voltage source comprises a status strobing circuit, a comparator, and a frequency control voltage regulator;
   the status strobing circuit comprises two parallel frequency branches and two parallel status branches, wherein input ends of the two parallel frequency branches are connected to outputs of the phase locked loop corresponding to the first functional module and the second functional module, respectively, input ends of the two parallel status branches are connected to status flag outputs corresponding to the first functional module and the second functional module, respectively, a second switch transistor is connected in series between an input end and an output end of each frequency branch, and the two parallel status branches are configured to drive the second switch transistors of the two frequency branches to be turned on or off, respectively;

two input ends of the comparator are connected to output ends of the two parallel frequency branches, respectively, and an output end of the comparator is configured to output a clock frequency of a frequency branch with a relatively large clock frequency among the two parallel frequency branches to the frequency control voltage regulator; and the frequency control voltage regulator is configured to match an input clock frequency with a preset frequency and voltage correspondence to determine a first target output voltage, and adjust, to the first target output voltage, a voltage value of a voltage bus connected to a functional module corresponding to the clock frequency equal to the clock frequency output by the comparator.

3. The power control system for heterogeneous computing as claimed in claim 2, wherein the handshake detection unit generates the status flags for the first functional module and the second functional module according to the following rules:

in response to that the first functional module sends the access request answer, flagging a status of the first functional module as a high level signal;

in response to that the first functional module does not send the access request answer, flagging a status of the first functional module as a low level signal;

in response to that the second functional module sends the response request answer, flagging a status of the second functional module as a high level signal; and in response to that the second functional module does not send the response request answer, flagging a status of the second functional module as a low level signal.

4. The power control system for heterogeneous computing as claimed in claim 3, wherein the status flags of the first functional module is connected to a first switch transistor corresponding to the first functional module, and the status flags of the second functional module is connected to a first switch transistor corresponding to the second functional module.

5. The power control system for heterogeneous computing as claimed in claim 2, wherein the preset frequency and voltage correspondence is obtained by calculation according to formula I:

$$f \approx K \frac{(V_{out} - V_{th})^\alpha}{V_{out}}, \quad \text{formula I}$$

where $V_{out}$ represents the first target output voltage, f represents the clock frequency output by the comparator, K represents a preset scale factor, α represents a process parameter under carrier velocity saturation, and $V_{th}$ represents a turn-on voltage of the first switch transistor.

6. The power control system for heterogeneous computing as claimed in claim 2, wherein the frequency-controlled voltage source further comprises a frequency multiplication calculating unit and an interpolating resistance direct-current (DC) converter;

two input ends of the frequency multiplication calculating unit are connected to the output ends of the two parallel frequency branches, respectively, and the frequency multiplication calculating unit is configured to calculate a multiple value of a relatively large clock frequency and a relatively small clock frequency of the two parallel frequency branches and output same to the interpolating resistance DC converter; and the interpolating resistance DC converter is configured to calculate a second target output voltage according to the multiple value and the first target output voltage, and adjust, to the second target output voltage, a voltage value of a voltage bus connected to a functional module corresponding to the clock frequency not equal to the clock frequency output by the comparator.

7. The power control system for heterogeneous computing as claimed in claim 6, wherein the second target output voltage is obtained by calculation according to formula II:

$$V_{oth} \approx K * \frac{V_{out}}{n}, \quad \text{formula II}$$

where $V_{oth}$ represents the second target output voltage, $V_{out}$ represents the first target output voltage, k represents a preset constant, and n represents the multiple value.

8. The power control system for heterogeneous computing as claimed in claim 2, wherein all the first switch transistors and all the second switch transistors are metal-oxide-semiconductor field-effect transistors.

9. The power control system for heterogeneous computing as claimed in claim 1, wherein the heterogeneous computing unit is of a Chiplet architecture, and comprises at least two of a central processing unit (CPU), a graphics processing unit (GPU), a data processing unit (DPU), a neural processing unit (NPU), a video processing unit (VPU), an image signal processor (ISP), an accelerator, and input output (IO).

10. A power control method for heterogeneous computing, comprising:

taking a functional module of a heterogeneous computing unit that sends an access request as a first functional module, and taking a functional module of the heterogeneous computing unit that is requested as a second functional module;

outputting, by a phase locked loop, a clock frequency corresponding to each functional module in the heterogeneous computing unit on a one-to-one basis;

connecting a handshake detection unit to the heterogeneous computing unit via an access bus, detecting, by the handshake detection unit, an access request answer sent by the first functional module and a response request answer sent by the second functional module, and generating, according to the access request answer and the response request answer, status flags for the first functional module and the second functional module, respectively, and outputting same; and outputting, by a frequency-controlled voltage source, one path of voltage bus for each functional module, connecting each path of voltage bus to a power pin of a corresponding functional module and connecting in series a first switch transistor therebetween, controlling, by the frequency-controlled voltage source according to the status flags of the first functional module and the second functional module, a corresponding first switch transistor to be turned on or off, and adjusting, according to the clock frequency, a voltage value of a corresponding voltage bus when the first switch transistor is turned on.

11. The power control method for heterogeneous computing as claimed in claim 10, wherein the frequency-controlled voltage source comprises a status strobing circuit, a comparator, and a frequency control voltage regulator;

the status strobing circuit comprises two parallel frequency branches and two parallel status branches, wherein input ends of the two parallel frequency branches are connected to outputs of the phase locked loop corresponding to the first functional module and the second functional module, respectively, input ends of the two parallel status branches are connected to status flag outputs corresponding to the first functional module and the second functional module, respectively, a second switch transistor is connected in series between an input end and an output end of each frequency branch, and driving, by the two parallel status branches, the second switch transistors of the two frequency branches to be turned on or off, respectively;

two input ends of the comparator are connected to output ends of the two parallel frequency branches, respectively, and an output end of the comparator is configured to output a clock frequency of a frequency branch with a relatively large clock frequency among the two parallel frequency branches to the frequency control voltage regulator; and matching, by the frequency control voltage regulator, an input clock frequency with a preset frequency and voltage correspondence to determine a first target output voltage, and adjusting, to the first target output voltage, a voltage value of a voltage bus connected to a functional module corresponding to the clock frequency equal to the clock frequency output by the comparator.

12. The power control method for heterogeneous computing as claimed in claim 11, wherein the handshake detection unit generates the status flags for the first functional module and the second functional module according to the following rules:

in response to that the first functional module sends the access request answer, flagging a status of the first functional module as a high level signal;

in response to that the first functional module does not send the access request answer, flagging a status of the first functional module as a low level signal;

in response to that the second functional module sends the response request answer, flagging a status of the second functional module as a high level signal; and in response to that the second functional module does not send the response request answer, flagging a status of the second functional module as a low level signal.

13. The power control method for heterogeneous computing as claimed in claim 12, wherein the status flags of the first functional module is connected to a first switch transistor corresponding to the first functional module, and the status flags of the second functional module is connected to a first switch transistor corresponding to the second functional module.

14. The power control method for heterogeneous computing as claimed in claim 11, wherein the preset frequency and voltage correspondence is obtained by calculation according to formula I:

$$f \approx K \frac{(V_{out} - V_{th})^\alpha}{V_{out}}, \qquad \text{formula I}$$

where $V_{out}$ represents the first target output voltage, f represents the clock frequency output by the comparator, K represents a preset scale factor, $\alpha$ represents a process parameter under carrier velocity saturation, and $V_{th}$ represents a turn-on voltage of the first switch transistor.

15. The power control method for heterogeneous computing as claimed in claim 11, wherein the frequency-controlled voltage source further comprises a frequency multiplication calculating unit and an interpolating resistance direct-current (DC) converter, and the method further comprises:

connecting two input ends of the frequency multiplication calculating unit to the output ends of the two parallel frequency branches, respectively, and calculating, by the frequency multiplication calculating unit, a multiple value of a relatively large clock frequency and a relatively small clock frequency of the two parallel frequency branches and outputting same to the interpolating resistance DC converter; and calculating, by the interpolating resistance DC converter according to the multiple value and the first target output voltage, a second target output voltage, and adjusting, to the second target output voltage, a voltage value of a voltage bus connected to a functional module corresponding to the clock frequency not equal to the clock frequency output by the comparator.

16. The power control method for heterogeneous computing as claimed in claim 15, wherein the second target output voltage is obtained by calculation according to formula II:

$$V_{oth} \approx K * \frac{V_{out}}{n}, \qquad \text{formula II}$$

where $V_{oth}$ represents the second target output voltage, $V_{oth}$ represents the first target output voltage, k represents a preset constant, and n represents the multiple value.

17. The power control method for heterogeneous computing as claimed in claim 11, wherein all the first switch transistors and all the second switch transistors are metal-oxide-semiconductor field-effect transistors.

18. The power control method for heterogeneous computing as claimed in claim 10, wherein the heterogeneous computing unit is of a Chiplet architecture, and comprises at least two of a central processing unit (CPU), a graphics processing unit (GPU), a data processing unit (DPU), a neural processing unit (NPU), a video processing unit (VPU), an image signal processor (ISP), an accelerator, and input output (IO).

19. A computer device, comprising:
at least one processor; and
a memory, storing a computer program which is capable of running in the processor, wherein the computer program, when executed by the processor, executes the method according to claim 10.

20. The computer device as claimed in claim 19, wherein the computer program, when executed by the processor, executes the method according to claim 11.

\* \* \* \* \*

UNITED STATES PATENT AND TRADEMARK OFFICE
CERTIFICATE OF CORRECTION

PATENT NO. : 12,393,261 B2
APPLICATION NO. : 18/878821
DATED : August 19, 2025
INVENTOR(S) : Yongzheng Zhan et al.

Page 1 of 1

It is certified that error appears in the above-identified patent and that said Letters Patent is hereby corrected as shown below:

On the Title Page

Item (54) and in the Specification, Column 1, Lines 1-4, Please list the title as follows:
"POWER CONTROL SYSTEM AND METHOD FOR HETEROGENOUS COMPUTING, DEVICE, AND NON-TRANSITORY READABLE STORAGE MEDIUM"

Signed and Sealed this
Twenty-first Day of October, 2025

John A. Squires
*Director of the United States Patent and Trademark Office*